United States Patent
Yu

(10) Patent No.: US 6,664,146 B1
(45) Date of Patent: *Dec. 16, 2003

(54) INTEGRATION OF FULLY DEPLETED AND PARTIALLY DEPLETED FIELD EFFECT TRANSISTORS FORMED IN SOI TECHNOLOGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 09/873,170

(22) Filed: Jun. 1, 2001

(51) Int. Cl.[7] ............................................... H01L 21/84
(52) U.S. Cl. ...................... 438/149; 438/527; 438/165; 438/766
(58) Field of Search ................................ 438/527, 528, 438/149, 765, 766, 162, 165

(56) References Cited

U.S. PATENT DOCUMENTS

| | | | | |
|---|---|---|---|---|
| 5,665,199 A | * | 9/1997 | Sahota et al. | 438/14 |
| 5,942,780 A | * | 8/1999 | Barsan et al. | 257/321 |
| 6,165,849 A | * | 12/2000 | An et al. | 438/275 |
| 6,333,532 B1 | * | 12/2001 | Davari et al. | 257/301 |
| 6,448,114 B1 | * | 9/2002 | An et al. | 438/142 |

FOREIGN PATENT DOCUMENTS

JP 2000100747 A * 4/2000

* cited by examiner

*Primary Examiner*—Caridad Everhart
(74) *Attorney, Agent, or Firm*—Monica H. Choi

(57) ABSTRACT

For fabricating field effect transistors with a semiconductor substrate in SOI (semiconductor on insulator) technology, a first hardmask is formed on a first area of the semiconductor substrate, and a first dielectric forming dopant is implanted into a second area of the semiconductor substrate that is not covered by the first hardmask. The first hardmask is removed from the first area of the semiconductor substrate. A second hardmask is formed on the second area of the semiconductor substrate, and a second dielectric forming dopant is implanted into the first area of the semiconductor substrate that is not covered by the second hardmask. A thermal anneal is performed to form a first buried insulating structure from the second dielectric forming dopant reacting within the first area of the semiconductor substrate and to form a second buried insulating structure from the first dielectric forming dopant reacting within the second area of the semiconductor substrate. A first semiconductor structure remains on top of the first buried insulating structure and has a different thickness from a second semiconductor structure remaining on top of the second buried insulating structure.

20 Claims, 3 Drawing Sheets

INTEGRATION OF FULLY DEPLETED AND PARTIALLY DEPLETED FIELD EFFECT TRANSISTORS FORMED IN SOI TECHNOLOGY

TECHNICAL FIELD

The present invention relates generally to fabrication of field effect transistors having scaled-down dimensions, and more particularly, to fabrication of both fully depleted and partially depleted field effect transistors on a semiconductor substrate in SOI (semiconductor on insulator) technology.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes spacers 122 disposed on the sidewalls of the gate electrode 118 and the gate dielectric 116. When the spacers 122 are comprised of silicon nitride ($Si_3N_4$), then a spacer liner oxide 124 is deposited as a buffer layer between the spacers 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. Elements such as the gate dielectric 116, the gate electrode 118, the spacers 122, and the spacer liner oxide 124 having the same reference number in FIGS. 1 and 2 refer to elements having similar structure and function.

A drain extension junction 156 and a source extension junction 158 of the MOSFET 150 are formed in the layer of semiconductor material 154. The drain extension junction 156 and the source extension junction 158 are shallow junctions to minimize short-channel effects in the MOSFET 150 having submicron or nanometer dimensions, as known to one of ordinary skill in the art of integrated circuit fabrication. A channel region 160 of the MOSFET 150 is the portion of the layer of semiconductor material 154 between the drain and source extension junctions 156 and 158.

In addition, a drain contact region 162 is formed by the drain extension junction 156, and a source contact region 164 is formed by the source extension junction 158. A drain silicide 166 is formed with the drain contact region 162 to provide contact to the drain of the MOSFET 150, and a source silicide 168 is formed with the source contact region 164 to provide contact to the source of the MOSFET 150. Processes for formation of such structures of the MOSFET 150 are known to one of ordinary skill in the art of integrated circuit fabrication.

The drain contact region 162 and the source contact region 164 are formed to extend down to contact the layer of buried insulating material 152. Thus, because the drain contact region 162 and the source contact region 164 of the MOSFET 160 do not form a junction with the semiconductor substrate 102, junction capacitance is minimized for the MOSFET 150 to enhance the speed performance of the MOSFET 150 formed with SOI (semiconductor on insulator) technology.

Furthermore, during operation of the MOSFET 150, the channel region 160 may be fully depleted when the layer of semiconductor material 154 is relatively thin having a thickness in a range of from about 50 angstroms to about 300 angstroms. When the channel region 160 of the MOSFET 150 is fully depleted, undesired short channel effects of the MOSFET 150 are further minimized, as known to one of ordinary skill in the art of integrated circuit fabrication. However, such a thin layer of semiconductor material 154 is undesirable because a low volume of the drain silicide 166 and the source silicide 168 results in high parasitic series resistance at the drain and the source of the MOSFET 150. Such high parasitic series resistance at the drain and the source of the MOSFET 150 degrades the speed performance of the MOSFET 150.

Thicker drain and source silicides may be formed when the layer of semiconductor material 154 has a relatively higher thickness in a range of from about 500 angstroms to about 1000 angstroms. However, with such a higher thickness of the layer of semiconductor material 154, the channel region 160 of the MOSFET 150 is partially depleted with less control of the electrical characteristics of the MOSFET 150.

Given such trade-offs, MOSFETs formed with both thin and thick layers of semiconductor material may be desired. For example, a MOSFET formed in a thin layer of semiconductor material to have a fully depleted channel region 160 may be desired for digital applications. On the other hand, a MOSFET formed in a thick layer of semiconductor material to have the partially depleted channel region 160 may be desired for analog applications.

Thus, a mechanism is desired for forming MOSFETs on semiconductor structures with multiple thicknesses to integrate MOSFETs that are fully depleted and partially depleted in SOI (semiconductor on insulator) technology.

SUMMARY OF THE INVENTION

Accordingly, in a general aspect of the present invention, semiconductor structures having multiple thicknesses are formed by forming a plurality of different buried insulating structures such that field effect transistors are formed with such semiconductor structures in SOI (semiconductor on insulator) technology.

In one embodiment of the present invention, for fabricating field effect transistors with a semiconductor substrate in SOI (semiconductor on insulator) technology, a first hardmask is formed on a first area of the semiconductor substrate. A first dielectric forming dopant is implanted with a first dose and a first depth into a second area of the semiconductor substrate that is not covered by the first hardmask while the second area of the semiconductor substrate is exposed. The first hardmask blocks the first dielectric forming dopant from being implanted into the first area of the semiconductor substrate. The first hardmask is removed from the first area of the semiconductor substrate.

In addition, a second hardmask is formed on the second area of the semiconductor substrate. A second dielectric forming dopant is implanted with a second dose and a second depth into the first area of the semiconductor substrate that is not covered by the second hardmask while the first area of the semiconductor substrate is exposed. The second hardmask blocks the second dielectric forming dopant from being implanted into the second area of the semiconductor substrate.

A thermal anneal is performed to form a first buried insulating structure from the second dielectric forming dopant reacting within the first area of the semiconductor substrate and to form a second buried insulating structure from the first dielectric forming dopant reacting within the second area of the semiconductor substrate. A first semiconductor structure comprised of semiconductor material of the semiconductor substrate and having a first thickness remains on top of the first buried insulating structure. A second semiconductor structure comprised of the semiconductor material of the semiconductor substrate and having a second thickness remains on top of the second buried insulating structure. The first thickness of the first semiconductor structure is greater than the second thickness of the second semiconductor structure.

The first thickness of the first semiconductor structure may be controlled to be less than the second thickness of the second semiconductor structure when the first depth of the first dielectric forming dopant implanted in the second area of the semiconductor substrate is less than the second depth of the second dielectric forming dopant implanted in the first area of the semiconductor substrate. Alternatively, the first dose of the first dielectric forming dopant implanted in the second area of the semiconductor substrate is greater than the second dose of the second dielectric forming dopant implanted in the first area of the semiconductor substrate.

In this manner, a plurality of semiconductor structures having multiple thicknesses are formed on different buried insulating structures in SOI (semiconductor on insulator) technology. Thus, a partially depleted field effect transistor is formed with the first semiconductor structure having a greater thickness, and a fully depleted field effect transistor is formed with the second semiconductor structure having a lower thickness. Thus, different types of field effect transistors are integrated on a die for the integrated circuit formed in SOI (semiconductor on insulator) technology.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
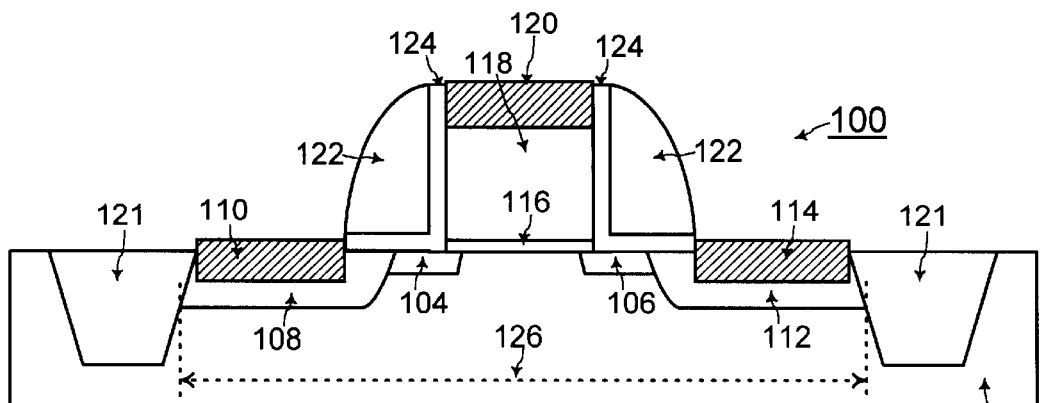
FIG. 1 shows a cross-sectional view of a conventional MOSFET (Metal Oxide Semiconductor Field Effect Transistor) fabricated within a bulk semiconductor substrate, according to the prior art.
Figure 2:
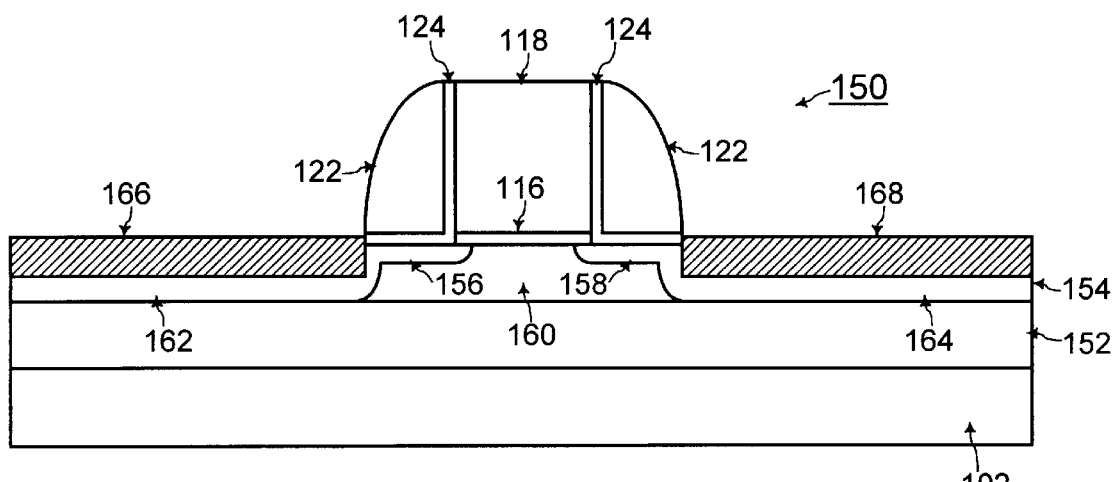
FIG. 2 shows a cross-sectional view of a MOSFET (Metal Oxide Semiconductor Field Effect Transistor) fabricated with SOI (semiconductor on insulator) technology for minimizing junction capacitance, according to the prior art.
Figure 3:
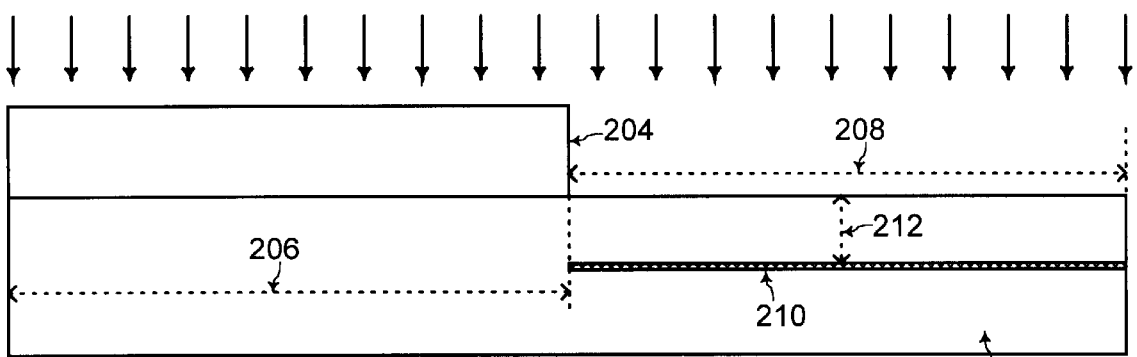
FIGS. 3, 4, 5, and 6 show cross-sectional views for illustrating the steps for forming a plurality of semiconductor structures having multiple thicknesses in SOI (semiconductor on insulator) technology by varying the depth of dielectric forming dopant implanted for forming different buried insulating structures, according to an embodiment of the present invention.

In the cross-sectional view of FIG. 3, for fabricating MOSFETs (Metal Oxide Semiconductor Field Effect Transistors) in SOI (semiconductor on insulator) technology, different buried insulating structures are formed within a semiconductor substrate 202, according to a general aspect of the present invention. In one embodiment of the present invention, the semiconductor substrate 202 is comprised of silicon.

Further referring to FIG. 3, a first hardmask 204 is formed over a first area 206 of the semiconductor substrate 202. The first hardmask 204 is comprised of silicon nitride ($Si_3N_4$) according to one embodiment of the present invention, and processes for depositing and patterning such material to form the first hardmask 204 over the first area 206 of the semiconductor substrate 202 are known to one of ordinary skill in the art of integrated circuit fabrication. A first dielectric forming dopant is implanted into a second area 208 of the semiconductor substrate 202 to form a first doped region 210 within the second area 208 of the semiconductor substrate 202. The first doped region 210 is doped with the first dielectric forming dopant being implanted at a first dose and is disposed at a first depth 212 from the surface of the semiconductor substrate 202. The first hardmask 204 blocks the first dielectric forming dopant from being implanted into first area 206 of the semiconductor substrate 202 during the implantation process for forming the first doped region 210.

The first dielectric forming dopant is comprised of oxygen ions according to one embodiment of the present invention. However, other types of dopants which form a dielectric with the semiconductor material of the semiconductor substrate 202 may be used to practice the present invention as would be apparent to one of ordinary skill in the art of integrated circuit fabrication from the description herein. In addition, implantation processes are known to one of ordinary skill in the art of integrated circuit fabrication, and mechanisms for varying parameters such as implantation energy and dose to control the first dose of the first dielectric forming dopant in the first doped region 210 and the first depth 212 of the first doped region 210 are known to one of ordinary skill in the art of integrated circuit fabrication.

Figure 4:
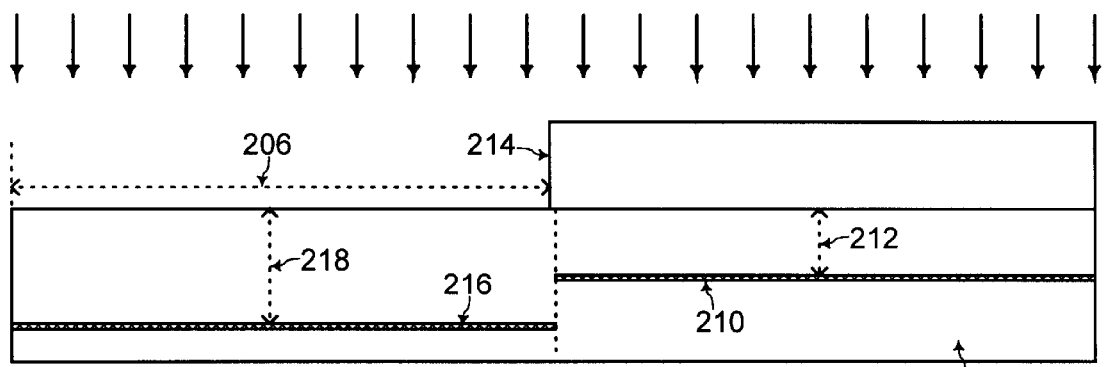

Referring to FIG. 4, after implantation of the first dielectric forming dopant to form the first doped region 210 within the second area 208 of the semiconductor substrate 202, the first hardmask 204 is removed from the semiconductor substrate 202. Processes for removing the first hardmask 204, comprised of silicon nitride ($Si_3N_4$) for example, are known to one of ordinary skill in the art of integrated circuit fabrication.

Further referring to FIG. 4, a second hardmask 214 is formed over a second area 208 of the semiconductor substrate 202. The second hardmask 214 is comprised of silicon nitride ($Si_3N_4$) according to one embodiment of the present invention, and processes for depositing and patterning such material to form the second hardmask 214 over the second area 208 of the semiconductor substrate 202 are known to one of ordinary skill in the art of integrated circuit fabrication. A second dielectric forming dopant is implanted into the first area 206 of the semiconductor substrate 202 to form a second doped region 216 within the first area 206 of the semiconductor substrate 202. The second doped region 216 is doped with the second dielectric forming dopant being implanted at a second dose and is disposed at a second depth 218 from the surface of the semiconductor substrate 202. The second hardmask 214 blocks the second dielectric forming dopant from being implanted into the second area 208 of the semiconductor substrate 202 during the implantation process for forming the second doped region 216.

The second dielectric forming dopant is comprised of oxygen ions according to one embodiment of the present invention. However, other types of dopants which form a dielectric with the semiconductor material of the semiconductor substrate 202 may be used to practice the present invention as would be apparent to one of ordinary skill in the art of integrated circuit fabrication from the description herein. In addition, implantation processes are known to one of ordinary skill in the art of integrated circuit fabrication, and mechanisms for varying parameters such as implantation energy and dose to control the second dose of the second dielectric forming dopant in the second doped region 216 and the second depth 218 of the second doped region 216 are known to one of ordinary skill in the art of integrated circuit fabrication.

Figure 5:
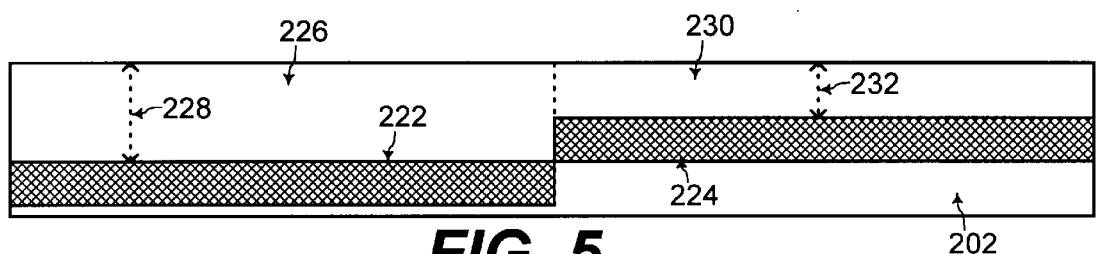

Referring to FIG. 5, a thermal anneal process is performed by heating up the semiconductor substrate 202 to a temperature in a range of from about 1600° Celsius to about 1700° Celsius for a time period of from about 1 hour to about 3 hours. During such a thermal anneal process, the second dielectric forming dopant of the second doped region 216 reacts with the semiconductor material within the first area 206 of the semiconductor substrate 202 to form a first buried insulating structure 222. When the second dielectric forming dopant is comprised of oxygen ions, the first buried insulating structure 222 is comprised of silicon dioxide ($SiO_2$) according to one embodiment of the present invention. Similarly, the first dielectric forming dopant of the first doped region 210 reacts with the semiconductor material within the second area 208 of the semiconductor substrate 202 to form a second buried insulating structure 224. When the first dielectric forming dopant is comprised of oxygen ions, the second buried insulating structure 224 is comprised of silicon dioxide ($SiO_2$) according to one embodiment of the present invention.

The semiconductor material of the first area 206 of the semiconductor substrate 202 remains on top of the first buried insulating structure 222 to form a first semiconductor structure 226. The first semiconductor structure 226 has a first thickness 228 of the portion of the semiconductor material of the semiconductor substrate 202 remaining on top of the first buried insulating structure 222. Similarly, the semiconductor material of the second area 208 of the semiconductor substrate 202 remains on top of the second buried insulating structure 224 to form a second semiconductor structure 230. The second semiconductor structure 230 has a second thickness 232 of the portion of the semiconductor material of the semiconductor substrate 202 remaining on top of the second buried insulating structure 224.

Referring to FIGS. 4 and 5, the first thickness 228 of the first semiconductor structure 226 is determined by the depth of the second doped region 216 and by the dose of the second dielectric forming dopant within the second doped region 216. Similarly, the second thickness 232 of the second semiconductor structure 230 is determined by the depth of the first doped region 210 and by the dose of the first dielectric forming dopant within the first doped region 210. For example, in the example of FIGS. 4 and 5, the second depth 218 of the second doped region 216 is greater than the first depth 212 of the first doped region 210.

Thus, the first buried insulating structure 222 is formed to be deeper within the first area 206 of the semiconductor substrate 202 than the second buried insulating structure 224 within the second area 208 of the semiconductor substrate 202 such that the first thickness 228 of the first semiconductor structure 226 is greater than the second thickness 232 of the second semiconductor structure 230. In one embodiment of the present invention, the first thickness 228 of the first semiconductor structure 226 is in a range of from about 500 angstroms to about 1000 angstroms, and the second thickness 232 of the second semiconductor structure 230 is in a range of from about 50 angstroms to about 300 angstroms.

Figure 6:
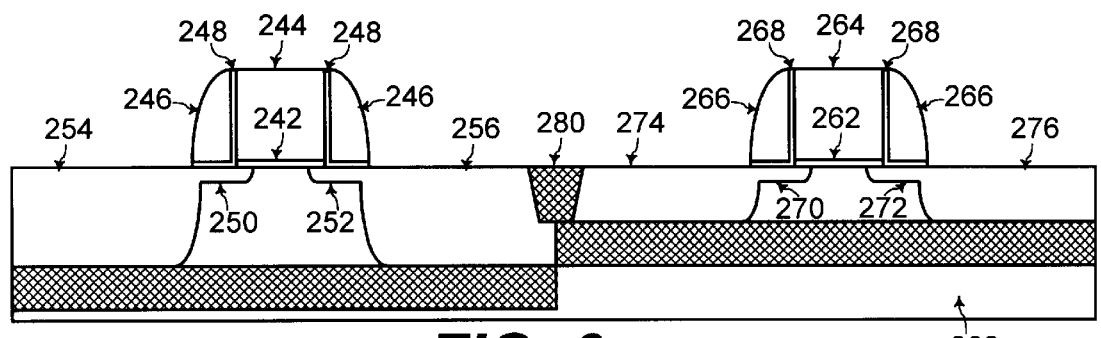

Referring to FIG. 6, a first MOSFET (Metal Oxide Semiconductor Field Effect Transistor) is formed with the thicker first semiconductor structure 226. The first MOSFET includes a gate dielectric 242, a gate electrode 244, spacers 246, a spacer liner oxide 248, a drain extension junction 250, a source extension junction 252, a drain contact region 254, and a source contact region 256. Processes for forming such structures 242, 244, 246, 248, 250, 252, 254, and 256 of the first MOSFET are known to one of ordinary skill in the art of integrated circuit fabrication. A second MOSFET (Metal Oxide Semiconductor Field Effect Transistor) is formed with the thinner second semiconductor structure 230. The second MOSFET includes a gate dielectric 262, a gate electrode 264, spacers 266, a spacer liner oxide 268, a drain extension junction 270, a source extension junction 272, a drain contact region 274, and a source contact region 276. Processes for forming such structures 262, 264, 266, 268, 270, 272, 274, and 276 of the second MOSFET are known to one of ordinary skill in the art of integrated circuit fabrication. A shallow trench isolation structure 280 comprised of a dielectric material such as silicon dioxide ($SiO_2$) for example electrically isolates the first MOSFET from the second MOSFET. Processes for formation of shallow trench isolation structures are known to one of ordinary skill in the art of integrated circuit fabrication.

Because the first MOSFET is formed with the thicker first semiconductor structure 226, the first MOSFET operates with the channel region being partially depleted. With the drain and source contact regions 254 and 256 being formed with the thicker first semiconductor structure 226, thicker silicides may be formed with the drain and source contact regions 254 and 256 such that series resistance at the drain and source is minimized for the first MOSFET. On the other hand, because the second MOSFET is formed with the thinner second semiconductor structure 230, the second MOSFET operates with the channel region being fully depleted such that undesired short channel effects are minimized for the second MOSFET.

In this manner, a plurality of semiconductor structures 226 and 230 having multiple thicknesses are formed on different buried insulating structures 222 and 224 in SOI (semiconductor on insulator) technology. Thus, a partially depleted MOSFET is formed with the first semiconductor structure 226 having a greater thickness 228, and a fully depleted MOSFET is formed with the second semiconductor structure 230 having a lower thickness 232. Thus, different types of MOSFETs are integrated on a die for the integrated circuit formed in SOI (semiconductor on insulator) technology.

Figure 7:
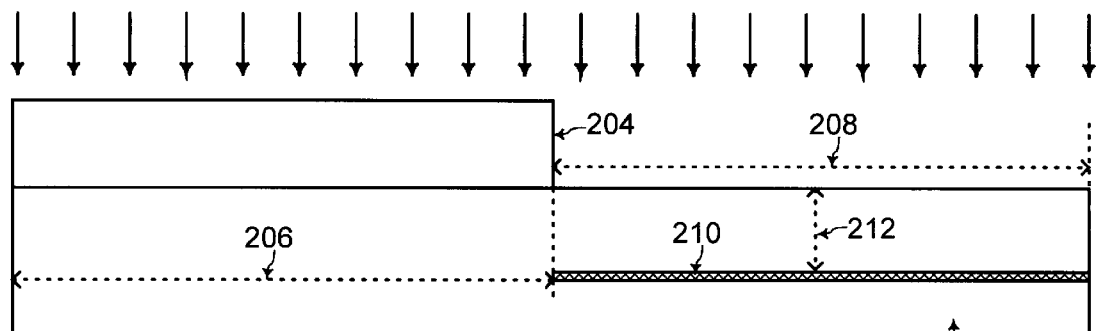
FIGS. 7, 8, and 9 shows cross-sectional views for illustrating the steps for forming a plurality of semiconductor structures having multiple thicknesses in SOI (semiconductor on insulator) technology by varying the dose of dielectric forming dopant implanted for forming different buried insulating structures, according to another embodiment of the present invention.
Figure 8:
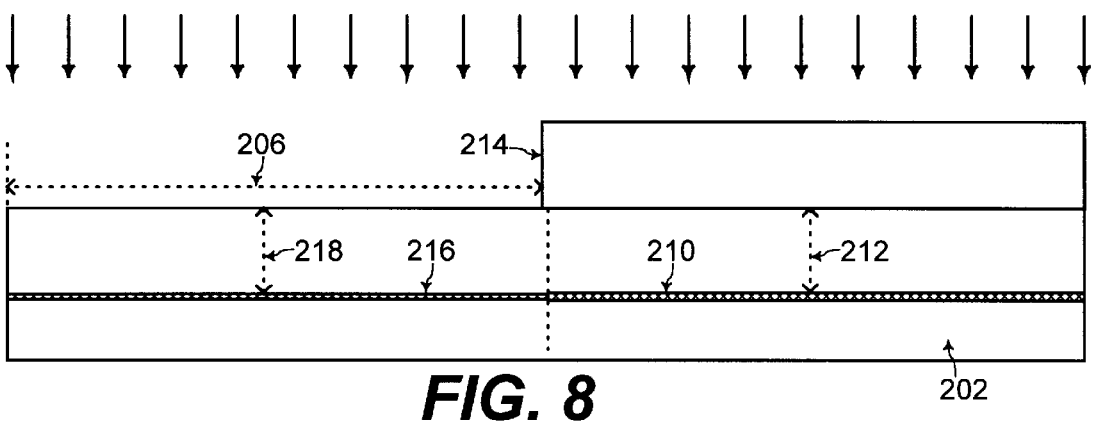

The foregoing is by way of example only and is not intended to be limiting. For example, referring to FIGS. 7, 8, and 9, the first semiconductor structure 226 and the second semiconductor structure 230 may be formed to have different thicknesses by varying the doses of the first and second dielectric forming dopants. Referring to FIG. 7, the first dielectric forming dopant is implanted into the second area 208 of the semiconductor substrate 202 with a first dose to form the first doped region 210. Referring to FIG. 8, the second dielectric forming dopant is implanted into the first area 206 of the semiconductor substrate 202 with a second dose to form the second doped region 216.

In the example illustrations of FIGS. 7 and 8, the first depth 212 of the first doped region 210 is substantially equal to the second depth 218 of the second doped region 216. However, the first dose of the first dielectric forming dopant implanted to form the first doped region 210 is greater than the second dose of the second dielectric forming dopant implanted to form the second doped region 216. For example, the first dose of the first dielectric forming dopant comprised of oxygen ions implanted to form the first doped region 210 and the second dose of the second dielectric forming dopant comprised of oxygen ions implanted to form the second doped region 216 are in a range of from about $1\times10^{17}$ oxygen ions/cm$^2$ to about $1\times10^{18}$ oxygen ions/cm$^2$. The first dose of the first dielectric forming dopant comprised of oxygen ions implanted to form the first doped region 210 is about $1\times10^{18}$ oxygen ions/cm$^2$, and the second dose of the second dielectric forming dopant comprised of oxygen ions implanted to form the second doped region 216 is about $1\times10^{17}$ oxygen ions/cm$^2$, according to one embodiment of the present invention.

Figure 9:
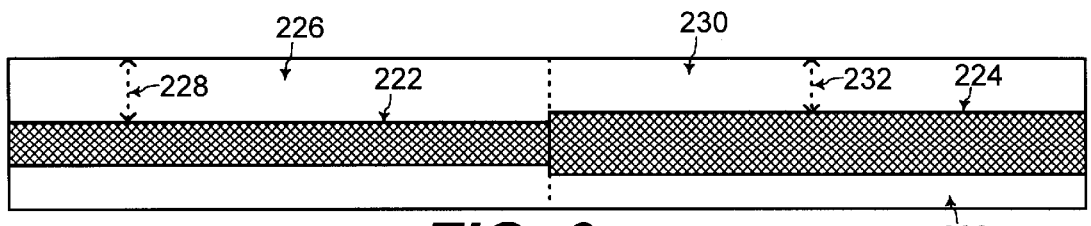

Referring to FIG. 9, with such different doses of the first and second dielectric forming dopants, after the thermal anneal for forming the first buried insulating structure 222 and the second buried insulating structure 224, the second buried insulating structure 224 has a higher thickness than the first buried insulating structure 222. In one embodiment of the present invention, the thicknesses of the first and second buried insulating structures 222 and 224 are in a range of from about 2000 angstroms to about 5000 angstroms. Referring to FIGS. 8 and 9, when the first depth 212 of the first doped region 210 is substantially equal to the second depth 218 of the second doped region 216, the thinner first buried insulating structure 222 results in the thicker first semiconductor structure 226, and the thicker second buried insulating structure 224 results in the thinner second semiconductor structure 230.

In another embodiment of the present invention, both the depth of the first and second doped regions 210 and 216 and the dose of the dielectric forming dopant within the first and second doped regions 210 and 216 may be adjusted to control the thickness of the first and second semiconductor structures 226 and 230, as would be apparent to one of ordinary skill in the art of integrated circuit fabrication from the description herein. Furthermore, the type of first and second dielectric forming dopant may be varied to control the thickness of the first and second semiconductor structures 226 and 230. In that case, the first dielectric forming dopant for forming the first doped region 210 is different from the second dielectric forming dopant for forming the second doped region 216. For example, when the first dielectric forming dopant for forming the first doped region 210 is comprised of oxygen ions and the second dielectric forming dopant for forming the second doped region 216 is comprised of nitrogen ions, the thickness of the first buried insulating structure 224 comprised of silicon nitride may be less than the thickness of the second buried insulating structure 224 comprised of silicon dioxide.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "depth," "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating field effect transistors with a semiconductor substrate in SOI (semiconductor on insulator) technology, the method including the steps of:

A. forming a first hardmask on a first area of said semiconductor substrate;

B. implanting a first dielectric forming dopant with a first dose and a first depth into a second area of said semiconductor substrate that is not covered by said first hardmask while said second area of said semiconductor substrate is exposed;

wherein said first hardmask blocks said first dielectric forming dopant from being implanted into said first area of said semiconductor substrate;

C. removing said first hardmask from said first area of said semiconductor substrate;

D. forming a second hardmask on said second area of said semiconductor substrate;

wherein said first and second hardmasks are comprised of silicon nitride ($Si_3N_4$);

E. implanting a second dielectric forming dopant with a second dose and a second depth into said first area of said semiconductor substrate that is not covered by said second hardmask while said first area of said semiconductor substrate is exposed;

wherein said second hardmask blocks said second dielectric forming dopant from being implanted into said second area of said semiconductor substrate;

wherein said first depth of said first dielectric forming dopant implanted in said second area of said semiconductor substrate is less than said second depth of said second dielectric forming dopant implanted in said first area of said semiconductor substrate;

wherein said first dose of said first dielectric forming dopant implanted in said second area of said semiconductor substrate is greater than said second dose of said second dielectric forming dopant implanted in said first area of said semiconductor substrate;

wherein said semiconductor substrate is comprised of silicon, and wherein said first and second dielectric forming dopants are comprised of oxygen ions;

wherein said first and second doses of said first and second dielectric forming dopants are in a range of from about $1\times10^{17}$ oxygen ions/cm$^2$ to about $1\times10^{18}$ oxygen ions/cm$^2$;

F. performing a thermal anneal to form a first buried insulating structure from said second dielectric forming dopant reacting within said first area of said semiconductor substrate and to form a second buried insulating structure from said first dielectric forming dopant reacting within said second area of said semiconductor substrate;

wherein said thermal anneal is performed at a temperature of from about 1600° Celsius to about 1700° Celsius for a time period of from about 1 hour to about 3 hours;

wherein a first semiconductor structure comprised of semiconductor material of said semiconductor substrate and having a first thickness remains on top of said first buried insulating structure;

wherein said first thickness of said first semiconductor structure is in a range of from about 500 angstroms to about 1000 angstroms;

wherein a second semiconductor structure comprised of said semiconductor material of said semiconductor substrate and having a second thickness remains on top of said second buried insulating structure;

and wherein said second thickness of said second semiconductor structure is in a range of from about 50 angstroms to about 300 angstroms;

G. forming a partially depleted field effect transistor with said first semiconductor structure; and H. forming a fully depleted field effect transistor with said second semiconductor structure.

2. A method for fabricating SOI (silicon on insulator) semiconductor structures on buried insulating structures, including the steps of:

forming a first mask on a second area of the semiconductor substrate and implanting in a first implantation step a first dopant into a first area of a semiconductor substrate while said first mask blocks said first dopant from being implanted into said second area;

etching away said first mask and forming a second mask on said first area;

implanting in a second implantation step a second dopant into the second area of said semiconductor substrate while said second mask blocks said second dopant from being implanted into the first area;

forming a first buried insulating structure with said first dopant, wherein a first semiconductor structure comprised of material of said semiconductor substrate remains on top of said first buried insulating structure; and forming a second buried insulating structure with said second dopant, wherein a second semiconductor structure comprised of material of said semiconductor substrate remains on top of said second buried insulating structure.

3. The method of claim 2, wherein a first thickness of said first semiconductor structure is different from a second thickness of said second semiconductor structures.

4. The method of claim 2, wherein said first and second masks are comprised of silicon nitride ($Si_3N_4$).

5. The method of claim 2, including the step of:

performing a thermal anneal to form said first and second buried insulating structures from said first and second dopants reacting within said first and second areas of said semiconductor substrate, respectively.

6. The method of claim 5, wherein said thermal anneal is performed at a temperature in a range of from about 1600° Celsius to about 1700° Celsius for a time period of from about 1 hour to about 3 hours.

7. The method of claim 2, wherein said first depth of said first dopant implanted in said first area of said semiconductor substrate is less than said second depth of said second dopant implanted in said second area of said semiconductor substrate.

8. The method of claim 2, wherein a first dose of said first dopant is greater than a second dose of said second dopant.

9. The method of claim 2, wherein said semiconductor substrate is comprised of silicon, and wherein said first and second dopants are comprised of oxygen ions.

10. The method of claim 9, wherein said first and second doses of said first and second dopants are in a range of from about $1\times10^{17}$ oxygen ions/cm$^2$ to about $1\times10^{18}$ oxygen ions/cm$^2$.

11. The method of claim 2, wherein said first thickness of said first semiconductor structure is in a range of from about 500 angstroms to about 1000 angstroms.

12. The method of claim 2, wherein said second thickness of said second semiconductor structure is in a range of from about 50 angstroms to about 300 angstroms.

13. The method of claim 2, wherein a thicknesses of said first buried insulating structure and of said second buried insulating structure are in a range of from about 2000 angstroms to about 5000 angstroms.

14. The method of claim 13, wherein a thickness of said first buried insulating structure is less than a thickness of said second buried insulating structure.

15. The method of claim 2, wherein said first dopant is different from said second dopant such that said first and second buried insulating structures are comprised of different materials.

16. A method for forming field effect transistors within a semiconductor substrate, including the steps of:

forming a first buried insulating structure within a first area of said semiconductor substrate with a first semiconductor structure comprised of material of said semiconductor substrate remaining on top of said first buried insulating structure;

forming a second buried insulating structure within a second area of said semiconductor substrate with a second semiconductor structure comprised of material of said semiconductor substrate remaining on top of said second buried insulating structure;

wherein a thickness of the first semiconductor structure is greater than a thickness of the second semiconductor structure;

forming a partially depleted field effect transistor with said first semiconductor structure and forming a fully depleted field effect transistor with said second semiconductor structure.

17. The method of claim 16, wherein the thickness of said first semiconductor structure is in a range of from about 500 angstroms to about 1000 angstroms, and wherein the thickness of said second semiconductor structure is in a range of from about 50 angstroms to about 300 angstroms.

18. The method of claim 16, wherein a thicknesses of said first buried insulating structure is different from a thickness of said second buried insulating structure.

19. The method of claim 18, wherein a thickness of said first buried insulating structure is less than a thickness of said second buried insulating structure.

20. The method of claim 16, wherein said first and second buried insulating structures are comprised of different materials.

* * * * *